United States Patent
Hirose et al.

(10) Patent No.: US 9,614,463 B2
(45) Date of Patent: Apr. 4, 2017

(54) PIEZOELECTRIC DEVICE, PIEZOELECTRIC ACTUATOR, HARD DISK DRIVE, AND INKJET PRINTER APPARATUS

(71) Applicant: TDK CORPORATION, Tokyo (JP)

(72) Inventors: Yuiko Hirose, Tokyo (JP); Yasuhiro Aida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 210 days.

(21) Appl. No.: 14/176,741

(22) Filed: Feb. 10, 2014

(65) Prior Publication Data

US 2015/0229238 A1  Aug. 13, 2015

(51) Int. Cl.
| | |
|---|---|
| H01L 41/04 | (2006.01) |
| H02N 2/00 | (2006.01) |
| H01L 41/187 | (2006.01) |
| B06B 1/02 | (2006.01) |
| H02N 2/14 | (2006.01) |
| H01L 41/09 | (2006.01) |

(52) U.S. Cl.
CPC ......... H02N 2/0075 (2013.01); H01L 41/042 (2013.01); H01L 41/1873 (2013.01); B06B 1/0253 (2013.01); B06B 2201/55 (2013.01); H01L 41/0973 (2013.01); H02N 2/14 (2013.01)

(58) Field of Classification Search
CPC ..... H02N 2/14; H01L 41/042; B06B 2201/55; B06B 1/0253; F02D 41/2096
USPC ........................................................ 318/116
See application file for complete search history.

(56) References Cited

U.S. PATENT DOCUMENTS

| | | | |
|---|---|---|---|
| 4,115,036 A | 9/1978 | Paterson | |
| 4,611,260 A * | 9/1986 | Bauer | H01G 7/02 29/25.35 |
| 2008/0239581 A1* | 10/2008 | Ikai | G11B 5/3136 360/272 |
| 2010/0182367 A1* | 7/2010 | Takagi | B41J 2/145 347/14 |
| 2010/0186718 A1 | 7/2010 | Klein et al. | |

(Continued)

FOREIGN PATENT DOCUMENTS

| | | |
|---|---|---|
| DE | 2707713 A1 | 9/1977 |
| DE | 102006060311 A1 | 6/2008 |

(Continued)

*Primary Examiner* — Kawing Chan
*Assistant Examiner* — Bradley Brown
(74) *Attorney, Agent, or Firm* — Oliff PLC (57) ABSTRACT

A piezoelectric device is provided with a piezoelectric element including a piezoelectric layer exhibiting a polarizability γ smaller than $1\times10^{-9}$ (C/(V·m)) in the case where an electric field is applied until polarization is saturated and a circuit having a means to set a minimum value of a drive electric field to become larger than a positive coercive electric field of the above-described piezoelectric layer and a means to set a maximum value of the above-described drive electric field to become smaller than (Pm'(maximum value of polarization)−Pr'(quasi-remanent polarization))/(1× $10^{-9}$) and, therefore, an object is to drive the piezoelectric element in an electric field range in which maximum piezoelectric characteristics are obtained, improve the characteristics of the piezoelectric device, and enhance the reliability.

7 Claims, 6 Drawing Sheets

(56) References Cited

U.S. PATENT DOCUMENTS

| | | | | |
|---|---|---|---|---|
| 2010/0213882 A1* | 8/2010 | Adachi | ................ | H02N 2/004 318/116 |
| 2011/0074888 A1* | 3/2011 | Fujii | ................... | B41J 2/04581 347/68 |
| 2012/0127136 A1* | 5/2012 | Schneider | ........... | G02F 1/13718 345/204 |
| 2013/0200751 A1 | 8/2013 | Schroeder | | |
| 2013/0207512 A1* | 8/2013 | Doshida | ............... | H01L 41/083 310/311 |

FOREIGN PATENT DOCUMENTS

| | | |
|---|---|---|
| DE | 102013200353 A1 | 9/2013 |
| EP | 1 001 474 A1 | 5/2000 |
| JP | A-5-114760 | 5/1993 |
| WO | 2013/165384 A1 | 11/2013 |

* cited by examiner

PIEZOELECTRIC DEVICE, PIEZOELECTRIC ACTUATOR, HARD DISK DRIVE, AND INKJET PRINTER APPARATUS

BACKGROUND OF INVENTION

Field of Invention

The present invention relates to a piezoelectric device provided with a piezoelectric element including a piezoelectric layer and a drive circuit to control a drive electric field applied to the piezoelectric layer, a piezoelectric actuator by using the piezoelectric device, and a hard disk drive provided with the piezoelectric actuator and an ink-jet printer apparatus.

Background Art

In recent years, instead of bulk piezoelectric materials, commercialization of a piezoelectric element by using a thin film piezoelectric material has proceeded. Examples include piezoelectric sensors taking advantage of a piezoelectric effect, in which a force applied to a piezoelectric layer is converted to a voltage, e.g., a gyro sensor, a pressure sensor, a pulse wave sensor, a shock sensor, and a microphone, piezoelectric actuators taking advantage of an inverse piezoelectric effect, in which a piezoelectric layer is deformed when a voltage is applied to the piezoelectric layer, e.g., a hard disk drive head slider and an ink-jet printer head, and a speaker, a buzzer, a resonator, and the like taking advantage of the inverse piezoelectric effect in the same manner.

Meanwhile, in the case where a piezoelectric material is made into a thin film, miniaturization of an element becomes possible, applicable fields are expanded and, in addition, mass productivity increases because many elements can be produced on a substrate in one operation. Furthermore, there are many advantages in performances, for example, the sensitivity is improved in the case where a sensor is produced.

[PTL 1] Japanese Unexamined Patent Application Publication No. 5-114760

SUMMARY OF INVENTION

When an electric field is applied to a piezoelectric material, polarization occurs in the piezoelectric material, and hysteresis is observed as a history along with changes in the polarization direction. A piezoelectric material showing hysteresis with a large squareness ratio, in which changes in the polarization are small relative to an applied electric field, does not exhibit large changes in the resulting piezoelectric characteristics even when the value of the applied electric field is changed. However, there are problems that, for example, a piezoelectric material showing hysteresis with a small squareness ratio does not have sufficient piezoelectric characteristics depending on the condition of the applied electric field and possibilities of occurrences of polarization degradation and durability degradation due to continuous drive of a piezoelectric element are high. In general, the squareness ratio of a thin film piezoelectric layer is small as compared with that of a bulk piezoelectric material and this tendency is considerable with respect to a lead-free piezoelectric layer.

Figure 1:
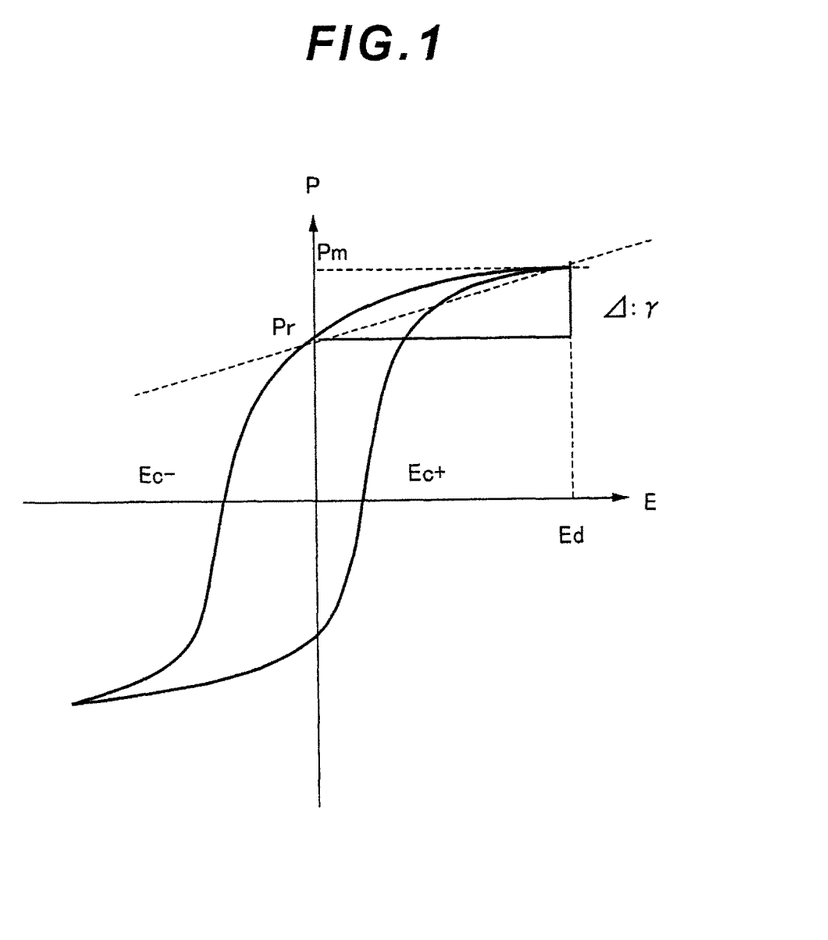
FIG. 1 shows P-E hysteresis in the saturated state of a piezoelectric layer according to the present invention.

FIG. 1 shows P-E (polarization-electric field) hysteresis, where an electric field is applied to the positive and negative electrode sides until polarization is saturated, in a piezoelectric material showing hysteresis with a relatively small squareness ratio. Electric fields at which polarization becomes 0 are a positive coercive electric field Ec+ and a negative coercive electric field Ec−.

In consideration of the above-described problems, according to the technology described in PTL 1, reduction in the amount of polarization during continuous driving of a piezoelectric actuator is suppressed even at a high temperature and a high pressure by a method in which a constantly positive electric field is applied to a piezoelectric material when the piezoelectric actuator is driven. However, this method is on the assumption that the piezoelectric material is a bulk piezoelectric material, and if this method is applied to a thin film piezoelectric layer, the film is broken easily even when an electric field not causing polarization degradation of the piezoelectric layer is applied. Also, in the case where an electric field less than or equal to the coercive electric field is applied, reduction in polarization degradation can be facilitated, although a sufficient displacement is not obtained.

The present invention has been made in consideration of the above-described problems included in the related art and it is an object to obtain a good output from a piezoelectric device by controlling a drive electric field applied to a piezoelectric layer by a drive circuit provided in the piezoelectric device on the basis of dielectric characteristics of the piezoelectric layer employed.

In order to achieve the above-described object, a piezoelectric device according to the present invention includes a piezoelectric element including a piezoelectric layer and electrode layers configured to sandwich the piezoelectric layer and a drive circuit to apply an alternating current drive electric field to the above-described piezoelectric layer through the above-described electrode layers, wherein a polarizability γ of the above-described piezoelectric layer in the case where an electric field is applied until polarization is saturated is smaller than $1\times10^{-9}$ (C/(V·m)), and the above-described drive circuit has a means to set a minimum value of the above-described drive electric field to become larger than a positive coercive electric field of the above-described piezoelectric layer and a means to set a maximum value of the above-described drive electric field to become smaller than (Pm'(maximum value of polarization)−Pr' (quasi-remanent polarization))/($1\times10^{-9}$), where polarizability: γ=(Pm (saturation polarization)−Pr (remanent polarization))/Ed (maximum value of applied electric field), the unit of polarization is (C/m$^2$), and the unit of electric field is (V/m).

As described above, in the case of the piezoelectric material showing a polarizability γ close to 0 under saturation and hysteresis with a large squareness ratio, even when the value of the applied electric field is changed, the resulting piezoelectric characteristics do not change significantly.

In the piezoelectric device, the minimum value of the drive electric field applied to the piezoelectric layer is set to become larger than the positive coercive electric field and, thereby, the polarization directions of crystal grains constituting the piezoelectric layer are equalized, so that the displacement of the piezoelectric element increases. In addition, the maximum value of the drive electric field is set to become smaller than (Pm' (maximum value of polarization)−Pr' (quasi-remanent polarization))/($1\times10^{-9}$) and, thereby, a displacement resulting from rotation of electric dipoles in domains of crystal grains constituting the piezoelectric layer is obtained, so that a larger displacement is obtained.

Figure 2:
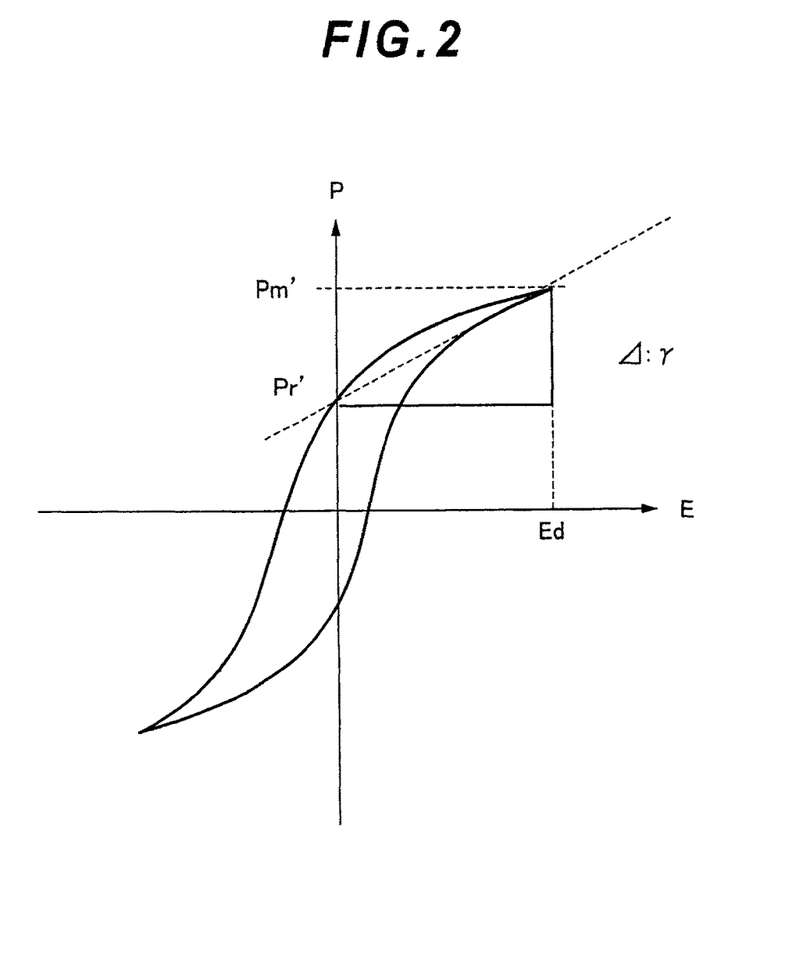
FIG. 2 shows P-E hysteresis in the unsaturated state of a piezoelectric layer according to the present invention.

FIG. 2 shows P-E hysteresis of a piezoelectric layer showing hysteresis with a relatively small squareness ratio, where an electric field at which polarization does not reach saturation is applied to the piezoelectric layer. Here, the maximum value of polarization Pm' refers to the amount of polarization of a piezoelectric layer in the case where the maximum value of a certain applied electric field Ed is applied to the piezoelectric layer, and the quasi-remanent polarization Pr' refers to the amount of polarization when the P-E hysteresis crosses the axis of the applied electric field=0 in the case where the maximum value of the applied electric field Ed is applied. In this regard, $1 \times 10^{-9}$ corresponds to the polarizability γ of the piezoelectric layer, and if an electric field is applied to the piezoelectric layer in such a way that (Pm'−Pr')/Ed is larger than $1 \times 10^{-9}$, the piezoelectric layer may be broken because of an electrostrictive effect. Therefore, the maximum value of the drive electric field is set to become smaller than the value at which the applied electric field becomes (Pm'−Pr')/($1 \times 10^{-9}$).

Preferably, the piezoelectric layer of the piezoelectric device according to the present invention has a coercive electric field on each of a positive electric field side and a negative electric field side, and the drive circuit of the piezoelectric device has a means to apply a positive electric field in a direction in which an absolute value of the coercive electric field takes on a small value and apply a negative electric field in a direction in which the absolute value of the coercive electric field takes on a large value. Consequently, driving can be performed in an electric field range in which the piezoelectric characteristics of the piezoelectric layer are larger, so that the displacement of the piezoelectric layer can further increase.

Preferably, the drive circuit provided in the piezoelectric device according to the present invention has a means to allow the minimum value of the above-described drive electric field to become more than or equal to 5 times the positive coercive electric field of the above-described piezoelectric layer and allow the maximum value of the above-described drive electric field to become less than or equal to 50 times the positive coercive electric field of the above-described piezoelectric layer. Consequently, a displacement resulting from rotation of electric dipoles in domains of crystal grains constituting the piezoelectric layer is obtained to a larger extent, so that the displacement of the piezoelectric layer can further increase.

Preferably, the piezoelectric layer of the piezoelectric device according to the present invention is made from potassium-sodium niobate. The coercive electric field of potassium-sodium niobate is small as compared with those of the other materials and domains in the crystal grains are small, so that an effect of increasing the displacement by setting the drive electric field is exerted considerably. Meanwhile, potassium-sodium niobate may contain Mn, Li, Ta, Ba, Sr, and Zr as additives.

A piezoelectric actuator according to the present invention includes the piezoelectric device having the above-described configuration. Specific examples of piezoelectric actuators include a head assembly of hard disk drive and piezoelectric actuator of an ink-jet printer head.

Then, a hard disk drive and an ink-jet printer apparatus according to the present invention include the above-described piezoelectric actuator.

According to the piezoelectric device related to the present invention, an output of the piezoelectric actuator can be improved and high performance hard disk drive and ink-jet printer apparatus can be provided.

DESCRIPTION OF PREFERRED EMBODIMENTS

A preferred embodiment according to the present invention will be described below in detail with reference to the drawings. In this regard, in the drawings, the same or equivalent members are indicated by the same reference numerals. Meanwhile, vertical and horizontal relationships between positions are as shown in the drawing. In this connection, the same explanations will not be provided.

(Piezoelectric Element)

Figure 3:
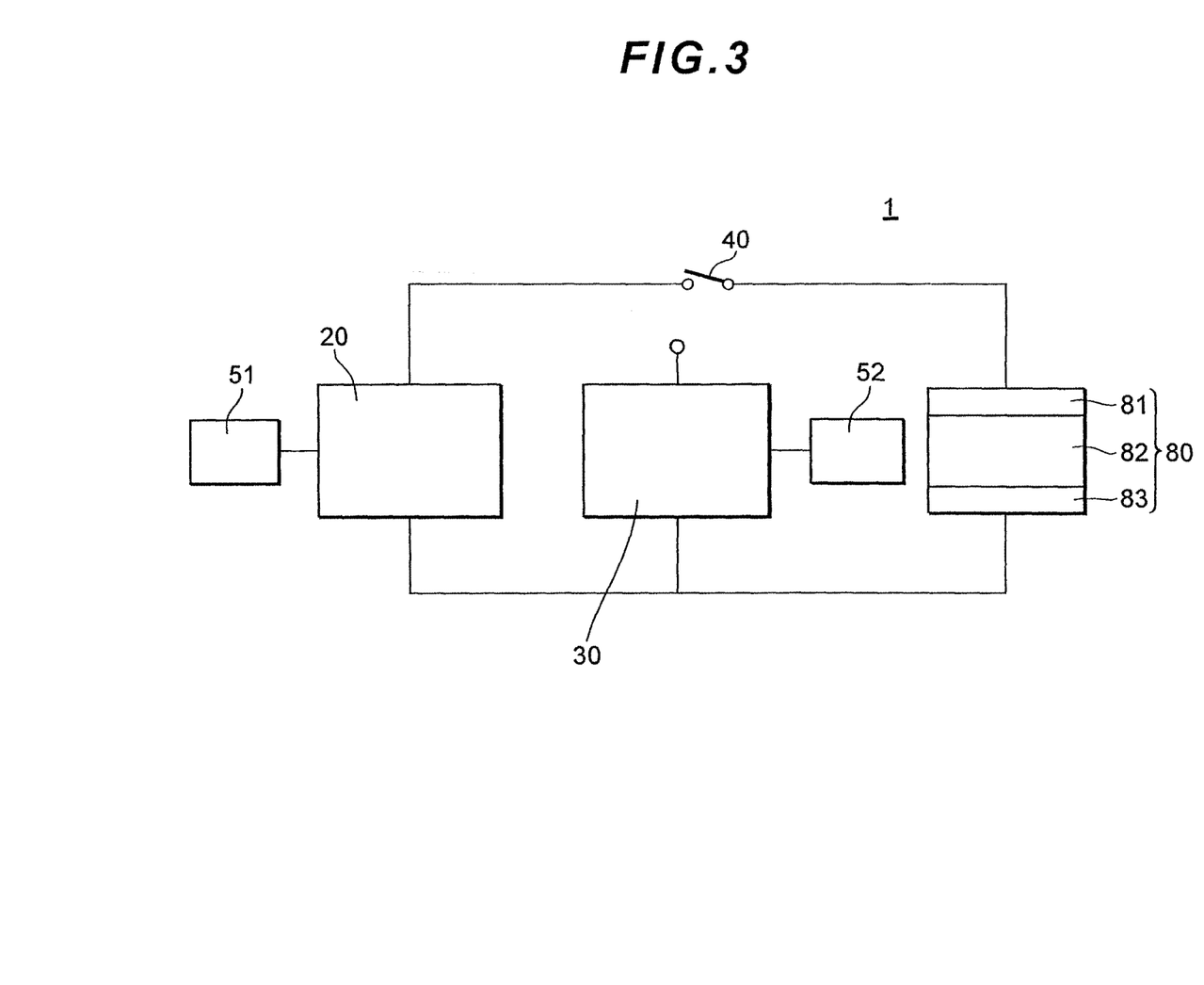
FIG. 3 is a power-line circuit configuration diagram of a piezoelectric device according to an embodiment of the present invention.

FIG. 3 shows a power-line circuit configuration diagram of a piezoelectric device 1 according to the present embodiment. The piezoelectric device 1 is provided with a piezoelectric element 80, a drive circuit 20 to control the drive electric field of the piezoelectric element 80, a current monitoring circuit 30 to monitor a current value flowing into the piezoelectric element 80, and a switching device 40, and the piezoelectric element 80 is provided with a first electrode layer 81, a piezoelectric layer 82 disposed on the first electrode layer 81, and a second electrode layer 83 disposed on the piezoelectric layer 82. In this regard, in FIG. 3, the piezoelectric element 80 is shown upside down.

The first electrode layer 81 is made from, for example, Pt (platinum). The first electrode layer 81 has a thickness of, for example, 0.02 μm or more and 1.0 μm or less. The first electrode layer 81 is made from Pt and, thereby, the piezoelectric layer 82 having high orientation property can be formed. Also, a metal material, e.g., Pd (palladium), Rh (rhodium), Au (gold), Ru (ruthenium), Ir (iridium), Mo (molybdenum), Ti (titanium), or Ta (tantalum), or an electrically conductive metal oxide, e.g., $SrRuO_3$ or $LaNiO_3$, can be used as the first electrode layer 81. The first electrode layer 81 can be formed by a sputtering method, a vacuum evaporation method, a printing method, a spin coating method, a sol-gel method, or the like.

As for the material used for the piezoelectric layer 82, a perovskite compound represented by a general formula $ABO_3$ is mentioned. In particular, the piezoelectric layer 82 is made from preferably (K, Na)$NbO_3$ (potassium-sodium niobate). The piezoelectric layer 82 exhibits a polarizability γ smaller than $1 \times 10^{-9}$ (C/(V·m)) under saturation but shows hysteresis with a relatively small squareness ratio, where polarizability: γ=(Pm (saturation polarization)−Pr (remanent polarization))/Ed (maximum value of applied electric field), (refer to FIG. 1).

The piezoelectric layer 82 can be formed by the sputtering method, the vacuum evaporation method, the printing method, the spin coating method, the sol-gel method, or the like. The thickness is specified to be, for example, about 1 μm or more and 5 μm or less.

The second electrode layer 83 is made from, for example, Pt. The second electrode layer 83 has a thickness of, for example, 0.02 μm or more and 1.0 μm or less. Alternatively, a metal material, e.g., Pd, Rh, Au, Ru, Ir, Mo, Ti, or Ta, or an electrically conductive metal oxide, e.g., $SrRuO_3$ or $LaNiO_3$, can also be used as the second electrode layer 83. The second electrode layer 83 can be formed by the sputtering method, the vacuum evaporation method, the printing method, the spin coating method, the sol-gel method, or the like.

Also, the piezoelectric element 80 may be coated with a protective film. Consequently, the reliability can be enhanced.

In the piezoelectric element 80, an intermediate layer may be provided in any one of or both of between the first electrode layer 81 and the piezoelectric layer 82 and between the piezoelectric layer 82 and the second electrode layer 83.

As for this intermediate layer, an electrically conductive oxide is used. In particular, $SrRuO_3$, $SrTiO_3$, $LaNiO_3$, $CaRuO_3$, $BaRuO_3$, $(La_xSr_{1-x})CoO_3$, $YBa_2Cu_3O_7$, $La_4BaCu_5O_{13}$, and the like are preferable because the electrical conductivity is high and the heat resistance is provided.

A laminate including the above-described piezoelectric element 80 is formed on a predetermined substrate, although the piezoelectric element 80 may not be provided with the substrate. The first electrode layer 81, the piezoelectric layer 82, and the second electrode layer 83 are stacked on the substrate and, thereafter, the piezoelectric element 80 is patterned by photolithography. Subsequently, the substrate can be removed by a dry etching method or the like. In the case where the piezoelectric element 80 is provided with the substrate, the substrate may be cut after patterning.

The size of the piezoelectric element 80 in the direction perpendicular to the stacking direction is not specifically limited and, for example, about 1.0 mm×0.3 mm can be employed.

The drive circuit 20 has a function of applying a predetermined electric field to the piezoelectric element 80. For example, the drive circuit 20 includes a charge pump and is connected to an external power supply 51, as shown in FIG. 3, so that a voltage output from the external power supply 51 can be amplified and a predetermined electric field can be output to the piezoelectric element 80.

As shown in FIG. 3, the piezoelectric device 1 may include the current monitoring circuit 30 in addition to the drive circuit 20. The current monitoring circuit 30 has a function of applying an electric field to the piezoelectric element 80 and monitoring polarization P at that time and a function of outputting a predetermined electric field value as a signal to the drive circuit 20.

Also, the piezoelectric device 1 may include the switching device 40. The switching device 40 has a function of electrically switching between connection to the drive circuit 20 and connection to the current monitoring circuit 30. Usually, when the piezoelectric device 1 is started, connection to the current monitoring circuit 30 is performed, and after Eul and Ell signals, which will be described later, obtained from the current monitoring circuit 30 are fed back to the drive circuit 20, a circuit switching operation is performed. However, the switching device 40 may be switched after a lapse of a predetermined time and a current monitoring operation may be performed, as described later.

The operations of the drive circuit 20, the current monitoring circuit 30, and the switching device 40 may be controlled by one integrated circuit collectively. Meanwhile, in the case where a plurality of piezoelectric devices are used in a piezoelectric system, the drive circuit 20, the current monitoring circuit 30, and the switching device 40 of the individual piezoelectric devices 1 may be combined into one integrated circuit.

(Method for Setting Drive Electric Field)

The drive circuit 20 provided in the piezoelectric device 1 according to the present invention has a means to set the minimum value Emin of the drive electric field to become larger than a positive coercive electric field Ec+ of the piezoelectric layer 82 and a means to set the maximum value Emax of the drive electric field to become smaller than (Pm' (maximum value of polarization)−Pr' (quasi-remanent polarization))/($1\times10^{-9}$) (C/(V·m)).

Here, $1\times10^{-9}$ (C/(V·m)) is shown as a numerical value corresponding to the polarizability γ, and this is in the case where the unit of polarization is (C/m$^2$) and the unit of electric field is (V/m). However, in the description below, (μC/cm$^2$) is used as the unit of polarization and (kV/mm) is used as the unit of electric field. Consequently, the critical value of the polarizability γ becomes 0.1.

Initially, the current monitoring circuit 30 and the piezoelectric element 80 are connected by the switching device 40, and an electric field is applied to the piezoelectric element 80 so as to measure the amount of polarization. The electric field applied at this time is obtained from an external power supply 52, and the applied electric field to the piezoelectric element 80 is increased from 0 kV/mm to an electric field at which the piezoelectric layer 82 is saturated (maximum value of applied electric field Ed in FIG. 1). Subsequently, one back-and-forth operation is performed, where the electric field is returned to 0 kV/mm, is applied up to −Ed thereafter, and is returned to Ed. A positive coerce electric field Ec+ is obtained by this operation. The lower limit value Ell of the applied electric field is determined from this information, and this electric field is output to the drive circuit 20.

Next, the above-described one back-and-forth operation is performed while the maximum value of applied electric field Ed from the current monitoring circuit 30 to the piezoelectric element 80 is gradually increased in increments of 0.1 kv/mm, and the polarizability γ is determined from (Pm' (maximum value of polarization)−Pr' (quasi-remanent polarization)) and the maximum value of applied electric field Ed on an increase basis (refer to FIG. 2). Then, a maximum applied electric field at which the polarizability γ does not exceed 0.1 is determined, this is specified to be the upper limit Eul of the applied electric field, and this electric field is output to the drive circuit 20.

Next, the drive circuit 20 and the piezoelectric element 80 are connected by switching the switching device 40 from the current monitoring circuit 30 to the drive circuit 20. The drive circuit 20 adjusts Emin and Emax within the range of input Ell to Eul on the basis of the condition and the like set for the drive circuit 20 in accordance with the signals from the piezoelectric system equipped with the piezoelectric device 1 and the characteristics necessary for the piezoelectric system, and fixes the range of the drive electric field to the piezoelectric element 80.

Then, the piezoelectric element 80 is operated within the range of the resulting Emin to Emax by using the external power supply 51.

At this time, it is preferable that, of the positive coercive electric field Ec+ and the negative coercive electric field Ec−, the direction on the side of the electric field having a small absolute value is specified to be positive, the electric field at P=0 in the positive direction is specified to be Ec+, and the electric field at P=0 in the negative direction is specified to be Ec−. In this regard, it is more preferable that the piezoelectric element 80 be operated while the positive coercive electric field Ec+ is specified to be the lower limit Ell and the electric field at which γ=0.1 is specified to be the upper limit Eul of the drive electric field. Consequently, the displacement of the piezoelectric element 80 of the piezoelectric device 1 can be further enhanced.

Also, it is more preferable that the piezoelectric element 80 is operated while the minimum value Emin in the drive electric field is specified to be more than or equal to 5 times the positive coercive electric field Ec+ of the above-described piezoelectric layer 82 and, in addition, the maximum value Emax of the above-described drive electric field is specified to be less than or equal to 50 times the positive coercive electric field Ec+ of the above-described piezoelectric layer 82. Consequently, the displacement of the piezoelectric element 80 of the piezoelectric device 1 can be further enhanced.

(Method for Measuring Piezoelectric Constant)

The piezoelectric constant of the piezoelectric element 80 constituting the piezoelectric device 1 is measured by the method described below.

A predetermined electric field is applied 1 kHz from the power supply 51 to the first electrode layer 81 and the second electrode layer 83, and the displacement of the piezoelectric element 80 is measured by using a laser displacement meter (produced by Ono Sokki Co., Ltd.). Then, the piezoelectric constant (−d31) is obtained by calculation on the basis of the formula described below.

$$d_{31} \cong -\frac{h_s^2}{3L^2} \frac{s_{11,p}}{s_{11,s}} \frac{\delta}{V}$$

where, $h_s$: thickness of substrate, $S_{11,p}$: modulus of elasticity of piezoelectric layer, $S_{11,s}$: modulus of elasticity of substrate, L: length of drive portion of piezoelectric layer, δ: displacement, and V: applied voltage (Piezoelectric Actuator)

Figure 4A:
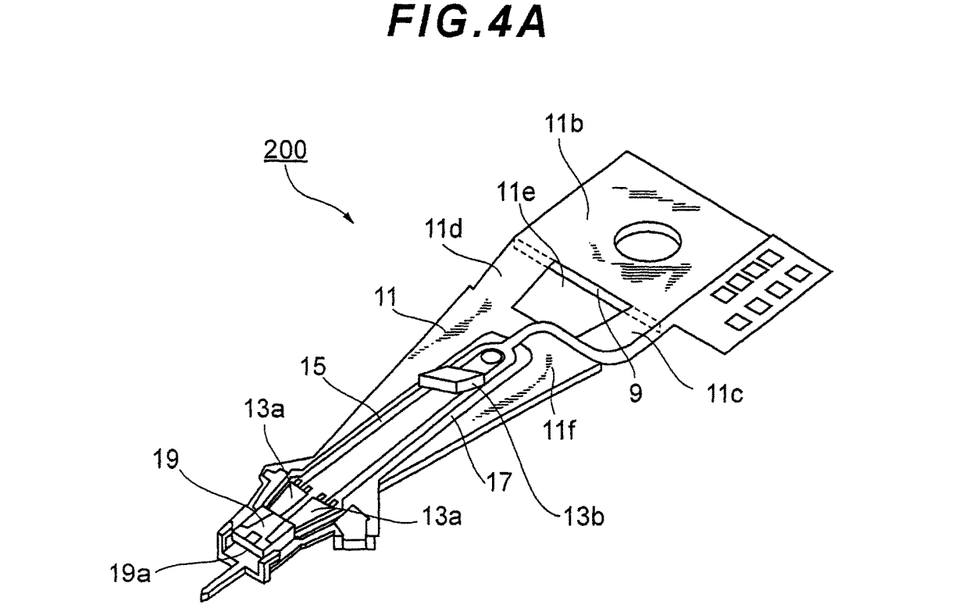
FIGS. 4A and 4B are configuration diagrams of a piezoelectric actuator according to the present invention.

FIG. 4A is a configuration diagram of a head assembly mounted on a hard disk drive (hereafter may be referred to as HDD) as an example of piezoelectric actuators including the piezoelectric device according to the present invention. As shown in this drawing, a head assembly 200 includes a base plate 9, a load beam 11, a flexure 17, a piezoelectric device 13 (1) provided with first and second piezoelectric elements 13a (80) serving as driver elements and an element circuit 13b, and a slider 19 provided with a head element 19a, as main constituents thereof.

The element circuit 13b is provided with an integrated circuit including a drive circuit, a current monitoring circuit, and a switching device. Meanwhile, a plurality of element circuits to control a plurality of piezoelectric elements may be combined into one integrated circuit. The element circuit 13b is disposed on a wiring flexible substrate 15 which is part of the flexure 17, although only a function may be added to a voice coil motor controller on a base of HDD.

In this regard, the load beam 11 includes a base end portion 11b fixed to the base plate 9 by beam welding or the like, first and second plate spring portions 11c and 11d extending from this base end portion 11b while tapering, an opening portion lie disposed between the first and second plate spring portions 11c and 11d, and a beam main portion 11f following the first and second plate spring portions 11c and 11d and extending linearly while tapering.

The first and second piezoelectric elements 13a are disposed on a wiring flexible substrate 15 which is part of the flexure 17, while keeping a predetermined distance from each other. The slider 19 is fixed to an end portion of the flexure 17 and is rotated in accordance with expansion and contraction of the first and second piezoelectric elements 13a.

The first and second piezoelectric elements 13a are formed from a first electrode layer, a second electrode layer, and a piezoelectric layer sandwiched between the first and second electrode layers. The piezoelectric actuator according to the present invention can obtain high reliability and a sufficient displacement because this piezoelectric device sets a drive electric field on the basis of examination of the applied electric field at which optimum piezoelectric characteristics provided for the individual piezoelectric elements can be exerted.

Figure 4B:
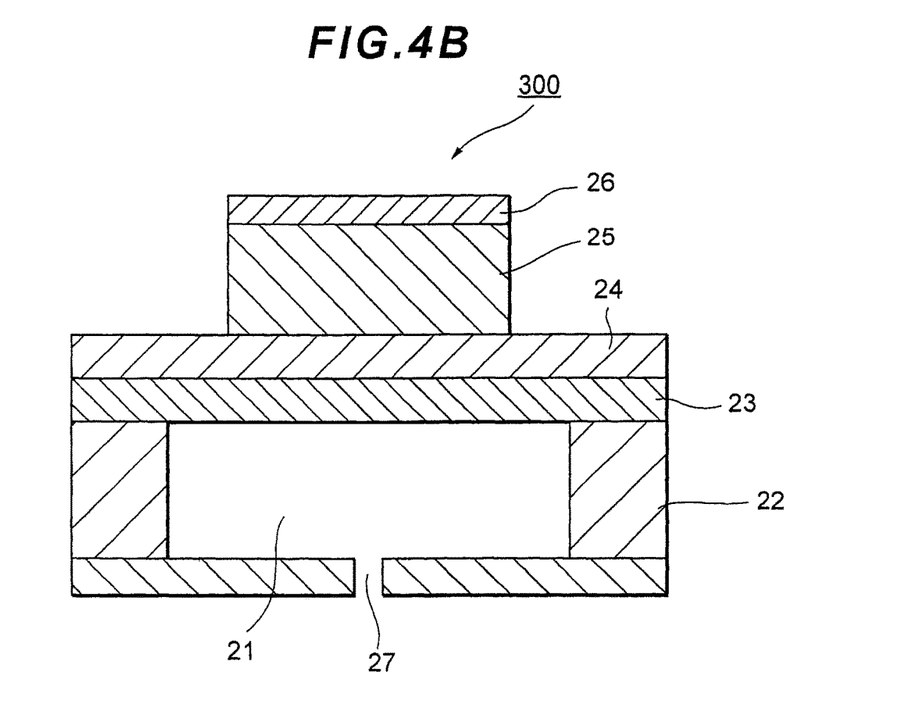

FIG. 4B is a configuration diagram of a piezoelectric actuator of an ink-jet printer head, as another example of the piezoelectric actuator including the above-described piezoelectric device, and shows an application example of the piezoelectric element 80 in the piezoelectric device 1.

A piezoelectric actuator 300 is formed by stacking an insulating layer 23, a lower electrode layer 24, a piezoelectric layer 25, and an upper electrode layer 26 on a substrate 22.

In the case where a predetermined ejection signal is not supplied and an electric field is not applied between the lower electrode layer 24 and the upper electrode layer 26, deformation does not occur in the piezoelectric layer 25. A pressure change does not occur in a pressure chamber 21 provided with a piezoelectric element supplied with no ejection signal, and an ink droplet is not ejected from a nozzle 27 thereof.

On the other hand, in the case where a predetermined ejection signal is supplied and a certain electric field is applied between the lower electrode layer 24 and the upper electrode layer 26, deformation occurs in the piezoelectric layer 25. The insulating film 23 is bent to a great extent in a pressure chamber 21 provided with the piezoelectric element supplied with an ejection signal. Consequently, the pressure in the pressure chamber 21 increases instantaneously, and an ink droplet is ejected from the nozzle 27.

Here, high reliability and a sufficient displacement can obtained by using the piezoelectric device to adjust and apply an electric field, at which optimum piezoelectric characteristics provided for the individual piezoelectric elements can be exerted, as the piezoelectric device of the piezoelectric actuator according to the present invention.

(Hard Disk Drive)

Figure 5:
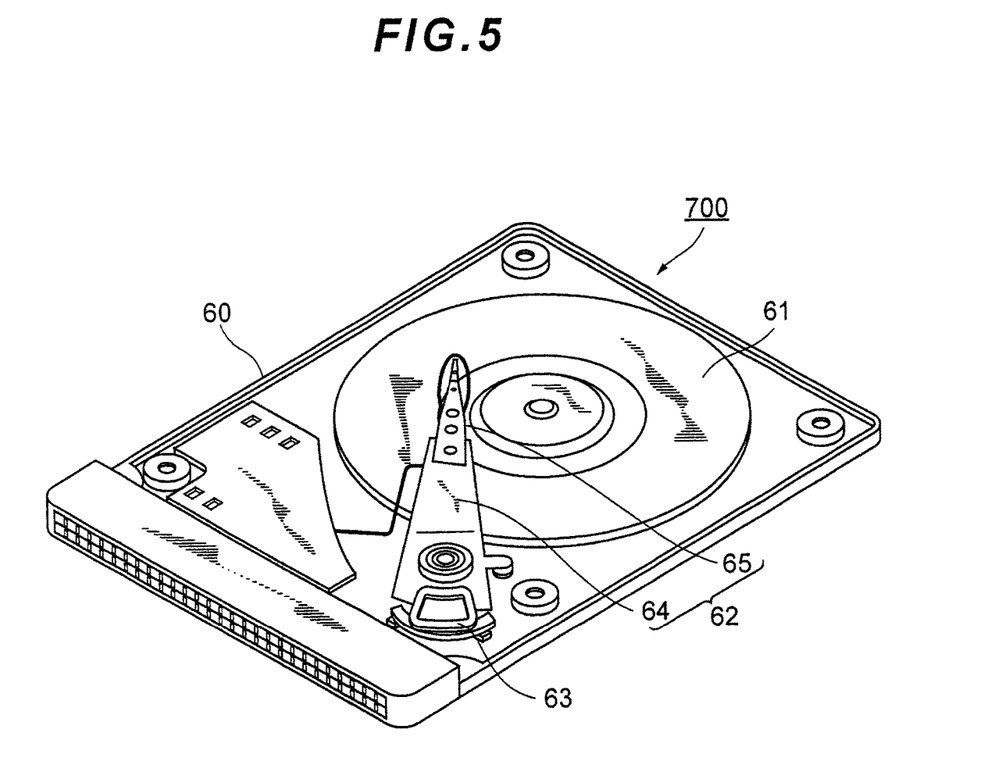
FIG. 5 is a configuration diagram of a hard disk drive according to the present invention.

FIG. 5 is a configuration diagram of a hard disk drive equipped with the head assembly shown in FIG. 4A.

A hard disk drive 700 is provided with a hard disk 61 serving as a recording medium and a head stack assembly 62 to record the magnetic information thereto and regenerate in a housing 60. The hard disk 61 is rotated by a motor, although not shown in the drawing.

In the head stack assembly 62, a plurality of assemblies formed from an actuator arm 64 supported by a voice coil motor 63 in such a way as to rotate freely around a spindle and a head assembly 65 connected to this actuator arm 64 are stacked in the depth direction in the drawing. The head slider 19 is attached to an end portion of the head assembly 65 in such a way as to opposite to the hard disk 61 (refer to FIG. 4A).

As for the head assembly 65 (200), a form in which the head element 19a (refer to FIG. 4A) is fluctuated in two steps is adopted. Relatively large movements of the head element 19a are controlled by whole drive of the head assembly 65 and the actuator arm 64 on the basis of the voice coil motor 63, and fine movements are controlled by drive of the head slider 19 by the end portion of the head assembly 65.

High reliability and sufficient accessibility can be obtained by using the piezoelectric device to adjust and apply an electric field, at which optimum piezoelectric characteristics provided for the individual piezoelectric elements can be exerted, as the piezoelectric device used for this head assembly 65.

(Ink Jet Printer Apparatus)

Figure 6:
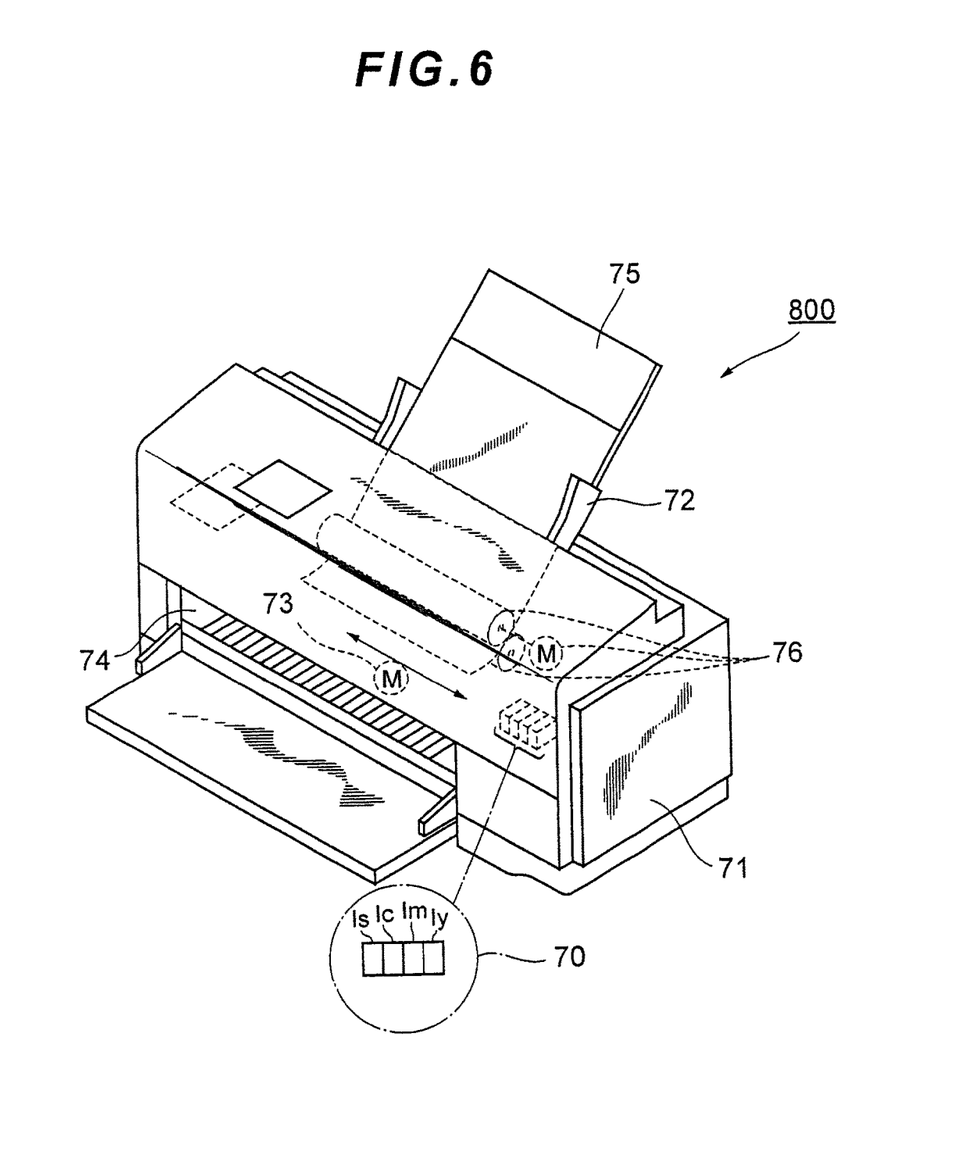
FIG. 6 is a configuration diagram of an ink-jet printer apparatus according to the present invention.

FIG. 6 is a configuration diagram of an ink-jet printer apparatus equipped with the ink-jet printer head shown in FIG. 4B.

An ink-jet printer apparatus 800 is configured to primarily include an ink-jet printer head 70, a main body 71, a tray 72, and a head drive mechanism 73. The piezoelectric actuator 300 is included in the ink-jet printer head 70.

The ink-jet printer apparatus 800 is provided with ink cartridges of four colors of yellow, magenta, cyan, and black in total and is configured to be able to perform full color printing. In addition, this ink-jet printer apparatus 800 is provided with an exclusive controller board and the like in the inside, and the ink ejection timing of the ink-jet printer head 70 and scanning of the head drive mechanism 73 are controlled. Meanwhile, the main body 71 is provided with the tray 72 on the back and is provided with an automatic sheet feeder (automatic continuous sheet feeding mechanism) 76 in the inside, so as to automatically send recording paper 75 and deliver the recording paper 75 from a front-mounted delivery port 74.

An ink-jet printer apparatus exhibiting high reliability and high safety can be provided by adjusting and applying an electric field, at which optimum piezoelectric characteristics provided for the individual piezoelectric elements can be exerted, with the piezoelectric device used for the piezoelectric actuator of this ink-jet printer head 70.

EXAMPLES

The present invention will be more specifically described below with reference to the examples and the comparative examples. However, the present invention is not limited to the following examples.

Example 1

Initially, the first electrode layer 81 serving as a substrate film of the piezoelectric layer 82 was obtained through crystal growth on a 3-inch substrate which is single crystal Si. This first electrode layer 81 was a Pt film and the film thickness was specified to be 0.2 μm. The forming method was a sputtering method and the film formation was performed while the substrate was heated to 500° C.

Subsequently, a sputtering target having a $(K_{0.5}Na_{0.5})NbO_3$ (potassium-sodium niobate) composition was used, and a film of the piezoelectric layer 82 was formed on the first electrode layer 81. The forming method was a sputtering method and, as with the first electrode layer 81, the film formation was performed under the condition in which the substrate was specified to be 7500° C. The film thickness was specified to be 2.0 μm (KNN1).

Then, a Pt film was formed as the second electrode layer 83 on the piezoelectric layer 82. The forming method was the sputtering method as with the first electrode layer 81, but the substrate temperature was specified to be 200° C. The film thickness was 0.2 μm.

Thereafter, the stacking structure on the substrate was patterned by photolithography, the substrate was removed by dry etching through RIE and, thereby, the piezoelectric element 80 having a movable portion dimension of 0.3 mm×1.0 mm, was produced.

Subsequently, a piezoelectric device 1 including one piezoelectric element 80 and having the circuit configuration as shown in FIG. 3 was formed. For the purpose of miniaturization and electric power saving, ASIC (application-specific IC) was used as an IC including the drive circuit 20, the current monitoring circuit 30, and the switching device 40.

Initially, an electric field at which the piezoelectric layer 82 was saturated was applied to the piezoelectric element 80 and, thereby, a negative coercive electric field Ec− of 0.44 kV/mm and a positive coercive electric field Ec+ of 1.02 kV/mm were obtained. Therefore, the lower limit value Ell of the applied electric field in this state was about 1 kV/mm. At this time, the polarizability γ=0.086.

Then, the maximum value of applied electric field Ed from the current monitoring circuit 30 to the piezoelectric element 80 was gradually increased in increments of 0.1 kv/mm, and the polarizability γ was determined from (Pm' (maximum value of polarization)−Pr' (quasi-remanent polarization)) and the maximum value of applied electric field Ed on an increase basis (refer to FIG. 2). At this time, 64 kV/mm was obtained as a maximum value of applied electric field Ed at which the polarizability γ did not exceed 0.1 and was maximum, that is, the upper limit Eu1 of the applied electric field.

The lower limit value Ell and the upper limit value Eul of the applied electric field obtained as described above were input as signals from the current monitoring circuit 30 into the drive circuit 20, and the switching device 40 was switched from the current monitoring circuit 30 to the drive circuit 20. Thereafter, in consideration of piezoelectric system constraints and the like, Emin was set at 5 kV/mm and Emax was set at 52 kV/mm. Subsequently, the piezoelectric element 80 was operated by a sinusoidal wave within the range of Emin to Emax.

Meanwhile, the piezoelectric characteristics of the piezoelectric element 80 were evaluated by using the laser displacement meter (produced by Ono Sokki Co., Ltd.). A sinusoidal wave with a frequency of 1 kHz was applied under the above-described condition of Emin and Emax, the displacement was measured, and the piezoelectric constant −d31 was determined. The piezoelectric constant −d31 of the piezoelectric element 80 in Example 1 was 37 μm/V.

Comparative Examples 1-1, 1-2, and 1-3

The configurations and production processes of piezoelectric elements of piezoelectric devices in Comparative examples 1-1, 1-2, and 1-3 were the same as those in Example 1. However, the settings in the drive circuits to determine Emin and Emax from Ell and Eul obtained from the current monitoring circuits were different.

That is, the piezoelectric constants were determined in the same manner as that in Example 1, where as for the respective conditions of the drive electric fields, the minimum value Emin of the drive electric field was specified to be smaller than 0 kV/mm (as a matter of course, smaller than the coercive electric field Ec+) in Comparative example 1-1, the minimum value Emin of the drive electric field was specified to be larger than 0 kV/mm and smaller than the coercive electric field Ec+ in Comparative example 1-2, and the maximum value Emax of the drive electric field was larger than the upper limit value Eul, at which the polarizability γ=0.1, in Comparative example 1-3.

Example 2

A piezoelectric device 1 in Example 2 was formed by using a piezoelectric element 80 having the same characteristics as those in Example 1. At this time, the magnitudes of two coercive electric fields obtained in measurement of the P-E hysteresis by the current monitoring circuit 30 in the piezoelectric device 1 were examined, and contrary to the setting in Example 1, of the two, the coercive electric field having a small absolute value was specified to be Ec+, the application direction of Ec+ was specified to be the positive electric field direction, and the piezoelectric constant was determined in the same manner as that in Example 1.

Example 3

The piezoelectric constant of the same piezoelectric device 1 as that in Example 2 was determined in the same manner as that in Example 1, where setting was performed in such a way that Emin and Emax were limited to more than or equal to 5 times the Ec+ and less than or equal to 50 times the Ec+, respectively, on the basis of the lower limit value Ell and the upper limit value Eul obtained from the current monitoring circuit 30.

Example 4

A piezoelectric device 1 in Example 4 was formed in the same manner as that in Example 1 except that the film formation temperature of the piezoelectric layer 82 was specified to be 800° C. and the piezoelectric constant was determined in the same manner as that in Example 1. This piezoelectric layer 82 (KNN2) exhibited Ec−, Ec+, γ, and Eul of 0.67 kv/mm, 1.26 kV/mm, 0.085, and 65 kV/mm, respectively.

Example 5

A piezoelectric device 1 in Example 5 was formed by using the same piezoelectric element 80 as in Example 4. The setting of the current monitoring circuit 30 in the piezoelectric device 1 at this time was specified to be the same as that in Example 2, and the piezoelectric constant was determined in the same manner as that in Example 1.

Example 6

A piezoelectric device 1 in Example 6 was formed by using the same piezoelectric element 80 as in Example 4. The setting of the drive circuit 20 in the piezoelectric device 1 at this time was specified to be the same as that in Example 3, and the piezoelectric constant was determined in the same manner as that in Example 1.

Comparative Example 2

A piezoelectric device 1 in Comparative example 2 was formed by using the same piezoelectric element 80 as in Example 4. The setting of the current monitoring circuit 30 in the piezoelectric device 1 at this time was specified to be the same as that in Comparative example 1-3, and the piezoelectric constant was determined in the same manner as that in Example 1.

Example 7

A piezoelectric device 1 in Example 7 was formed in the same manner as that in Example 1 except that the material for the piezoelectric layer 82 was specified to be $(Bi_{0.5}Na_{0.5})TiO_3$ and the piezoelectric constant was determined in the same manner as that in Example 1. This piezoelectric layer 82 (BNT) exhibited Ec−, Ec+, γ, and Eul of 0.25 kV/mm, 0.53 kV/mm, 0.081, and 60 kV/mm, respectively.

Example 8

A piezoelectric device 1 in Example 8 was formed by using the same piezoelectric element 80 as in Example 7. The setting of the current monitoring circuit 30 in the piezoelectric device 1 at this time was specified to be the same as that in Example 2, and the piezoelectric constant was determined in the same manner as that in Example 1.

Example 9

A piezoelectric device 1 in Example 9 was formed by using the same piezoelectric element 80 as in Example 7. The setting of the drive circuit 20 in the piezoelectric device 1 at this time was specified to be the same as that in Example 3, and the piezoelectric constant was determined in the same manner as that in Example 1.

Comparative Example 3

A piezoelectric device 1 in Comparative example 3 was formed by using the same piezoelectric element 80 as in Example 7. The setting of the drive circuit 20 in the piezoelectric device 1 at this time was specified to be the same as that in Comparative example 1-3, and the piezoelectric constant was determined in the same manner as that in Example 1.

Examples 10 to 17

Film formation was performed, where the material for the piezoelectric layer 82 was $(K_{0.5}Na_{0.5})NbO_3$, the film formation temperature was 700° C., and the film thickness was changed. The film thicknesses of the piezoelectric layers 82 (KNN3) in Examples 10 to 17 at this time were 1.0 μm, 1.4 μm, 1.6 μm, 2.1 μm, 2.5 μm, 2.9 μm, 3.1 μm, and 3.5 μm, respectively. Piezoelectric devices 1 in Examples 10 to 17 were formed in the same manner as that in Example 3 except the piezoelectric layer 82, and the piezoelectric constants were determined in the same manner as that in Example 1. This piezoelectric layer 82 exhibited Ec−, Ec+, γ, and Eul of about 0.8 kV/mm, 0.4 kV/mm, 0.088, and 100 kV/mm, respectively.

Table 1 shows the measurement results of Pm', Pr', (Pm'−Pr')/0.1, Ec−, Ec+, 5Ec+, 50Ec+, and the piezoelectric layer thickness t of the piezoelectric element used in Comparative examples 1-1 to 1-3, 2, and 3 and Examples 1 to 17, Ell and Eul obtained from the current monitoring circuit of the piezoelectric element, Emin and Emax obtained from the drive circuit, and the piezoelectric constant —d31.

The piezoelectric constants of the piezoelectric devices 1 in Examples 1 to 17, where the drive electric fields were controlled to be predetermined values by the drive circuits 20, were larger than those of the piezoelectric devices in Comparative examples 1-1 to 1-3, 2, and 3, where the above-described condition was not provided. Consequently, it was ascertained that the piezoelectric device 1 according to the present invention was driven in the range in which the displacement was obtained more efficiently with respect to the electric field.

The piezoelectric constants of the piezoelectric devices 1 in Examples 2, 3, 5, 6, 8, and 9 to 17, where a means to apply a positive electric field in the direction in which the absolute value of the coercive electric field took on a small value and apply a negative electric field in the direction in which the absolute value of the coercive electric field took on a large value was included, were larger than the piezoelectric constants of the piezoelectric devices 1 in Examples 1, 4, and 7. Consequently, it was ascertained that these piezoelectric devices were driven in the electric field range in which the displacements of the piezoelectric elements were still larger. The reason for this is considered to be that a displacement resulting from rotation of electric dipoles in domains of crystal grains is obtained to a larger extent.

The piezoelectric constants of the piezoelectric devices 1 in Examples 3, 6, and 9 to 17, where the minimum value Emin of the drive electric field was set at more than or equal to 5 times the Ec+ and the maximum value Emax of the drive electric field was set at less than or equal to 50 times the Ec+, were still larger. Consequently, it was ascertained that these piezoelectric devices were driven in the electric field range in which the displacements of the piezoelectric elements were still larger because of displacements resulting from rotation of electric dipoles in domains of crystal grains.

In Examples 10 to 17, there was a tendency of the piezoelectric constant to increase as the film thickness of the piezoelectric layer 82 increased from 1.0 μm and to decrease when 2.5 μm was exceeded. The reason for this is estimated that as the film thickness of the piezoelectric layer 82 increases, the crystallinity is improved and the piezoelectric constant increases, although when about 2.5 μm is exceeded, the crystallinity of the first electrode layer 81 is not inherited and crystals exhibiting different orientation increases.

As described above, the piezoelectric device by using a circuit to control the drive electric field within an appropriate range can realize a sufficiently large piezoelectric constant.

Up to this point, the preferred embodiment according to the present invention has been explained. However, the present invention is not limited to the above-described embodiment, various modifications can be added within the bounds of not departing from the gist of the present invention and, as a matter of course, they are included in the present invention.

For example, in the above-described embodiment, the current monitoring circuit 30 is disposed in addition to the drive circuit 20. However, the current monitoring circuit 30 is not indispensable. That is, if a favorable drive electric field range of the piezoelectric element 80 can be determined by a prove measurement or the like, the effect of the present invention is exerted even when the configuration does not include the current monitoring circuit 30. In that case, the switching device 40 is not necessary, as a matter of course.

Meanwhile, in the above-described embodiment, the piezoelectric element 80 is operated by using the drive circuit 20 and the external power supply 51, although the piezoelectric element 80 can also be operated by using another power supply included in the piezoelectric device.

TABLE 1

|  | Material | Pm' [μC/cm²] | Pr' [μC/cm²] | (Pm'-Pr')/0.1 [kV/mm] | Ec− [kV/mm] | Ec+ [kV/mm] | 5Ec+ [kV/mm] | 50Ec+ [kV/mm] | t [μm] |
|---|---|---|---|---|---|---|---|---|---|
| Comparative example 1-1 | KKN1 | 26 | 19.6 | 64 | 0.44 | 1.02 | 5.1 | 51.0 | 2.0 |
| Comparative example 1-2 | KKN1 | 26 | 19.6 | 64 | 0.44 | 1.02 | 5.1 | 51.0 | 2.0 |
| Comparative example 1-3 | KKN1 | 26 | 19.6 | 64 | 0.44 | 1.02 | 5.1 | 51.0 | 2.0 |
| Comparative example 2 | KNN2 | 14.8 | 8.3 | 65 | 0.67 | 1.26 | 6.3 | 63.0 | 2.0 |
| Comparative example 3 | BNT | 34 | 28 | 60 | 0.25 | 0.53 | 2.7 | 26.5 | 2.0 |
| Example 1 | KKN1 | 26 | 19.6 | 64 | 0.44 | 1.02 | 5.1 | 51.0 | 2.0 |
| Example 2 | KKN1 | 26 | 19.6 | 64 | 1.02 | 0.44 | 2.2 | 22.0 | 2.0 |
| Example 3 | KKN1 | 26 | 19.6 | 64 | 1.02 | 0.44 | 2.2 | 22.0 | 2.0 |
| Example 4 | KNN2 | 14.8 | 8.3 | 65 | 0.67 | 1.26 | 6.3 | 63.0 | 2.0 |
| Example 5 | KNN2 | 14.8 | 8.3 | 65 | 1.26 | 0.67 | 3.4 | 33.5 | 2.0 |
| Example 6 | KNN2 | 14.8 | 8.3 | 65 | 1.26 | 0.67 | 3.4 | 33.5 | 2.0 |
| Example 7 | BNT | 34 | 28 | 60 | 0.25 | 0.53 | 2.7 | 26.5 | 2.0 |
| Example 8 | BNT | 34 | 28 | 60 | 0.53 | 0.25 | 1.3 | 12.5 | 2.0 |
| Example 9 | BNT | 34 | 28 | 60 | 0.53 | 0.25 | 1.3 | 12.5 | 2.0 |
| Example 10 | KNN3 | 30 | 20 | 100 | 0.8 | 0.4 | 2.0 | 20.0 | 1.0 |
| Example 11 | KNN3 | 30 | 20 | 100 | 0.8 | 0.4 | 2.0 | 20.0 | 1.4 |
| Example 12 | KNN3 | 30 | 20 | 100 | 0.8 | 0.4 | 2.0 | 20.0 | 1.6 |
| Example 13 | KNN3 | 30 | 20 | 100 | 0.8 | 0.4 | 2.0 | 20.0 | 2.1 |
| Example 14 | KNN3 | 30 | 20 | 100 | 0.8 | 0.4 | 2.0 | 20.0 | 2.5 |
| Example 15 | KNN3 | 30 | 20 | 100 | 0.8 | 0.4 | 2.0 | 20.0 | 2.9 |
| Example 16 | KNN3 | 30 | 20 | 100 | 0.8 | 0.4 | 2.0 | 20.0 | 3.1 |
| Example 17 | KNN3 | 30 | 20 | 100 | 0.8 | 0.4 | 2.0 | 20.0 | 3.5 |

|  | Ell [kV/mm] | Eul [kV/mm] | Emin [kV/mm] | Emax [kV/mm] | −d31 [pm/V] |
|---|---|---|---|---|---|
| Comparative example 1-1 | 1.02 | 64 | −2.0 | 55.0 | 5 |
| Comparative example 1-2 | 1.02 | 64 | 0.5 | 55.0 | 6 |
| Comparative example 1-3 | 1.02 | 64 | 5.0 | 65.0 | 10 |
| Comparative example 2 | 1.26 | 65 | 6.0 | 70.0 | 13 |
| Comparative example 3 | 0.53 | 60 | 2.0 | 61.0 | 13 |
| Example 1 | 1.02 | 64 | 5.0 | 52.0 | 37 |
| Example 2 | 0.44 | 64 | 2.0 | 24.0 | 50 |
| Example 3 | 0.44 | 64 | 3.0 | 20.0 | 78 |
| Example 4 | 1.26 | 65 | 6.0 | 60.0 | 38 |
| Example 5 | 0.67 | 65 | 3.0 | 35.0 | 53 |
| Example 6 | 0.67 | 65 | 5.0 | 30.0 | 83 |
| Example 7 | 0.53 | 60 | 2.0 | 30.0 | 40 |

TABLE 1-continued

| | | | | | |
|---|---|---|---|---|---|
| Example 8 | 0.25 | 60 | 1.0 | 13.0 | 56 |
| Example 9 | 0.25 | 60 | 2.0 | 11.0 | 85 |
| Example 10 | 0.40 | 100 | 3.0 | 15.0 | 77 |
| Example 11 | 0.40 | 100 | 3.0 | 15.0 | 78 |
| Example 12 | 0.40 | 100 | 3.0 | 15.0 | 94 |
| Example 13 | 0.40 | 100 | 3.0 | 15.0 | 105 |
| Example 14 | 0.40 | 100 | 3.0 | 15.0 | 110 |
| Example 15 | 0.40 | 100 | 3.0 | 15.0 | 107 |
| Example 16 | 0.40 | 100 | 3.0 | 15.0 | 84 |
| Example 17 | 0.40 | 100 | 3.0 | 15.0 | 76 |

What is claimed is:

1. A piezoelectric device comprising:
a piezoelectric element including a piezoelectric layer and electrode layers configured to sandwich the piezoelectric layer; and
a drive circuit that applies an alternating current drive electric field to the piezoelectric layer through the electrode layers,
wherein a polarizability γ of the piezoelectric layer in the case where an electric field is applied until polarization is saturated is smaller than
$1 \times 10^{-9}$ (C/(V·m)), and
the drive circuit sets a minimum value of the drive electric field to become larger than a positive coercive electric field of the piezoelectric layer and sets a maximum value of the drive electric field to become smaller than ($Pm'$(maximum value of polarization)–$Pr'$(quasi-remanent polarization))/($1 \times 10^{-9}$) (C/(V·m))
where polarizability γ=(Pm (saturation polarization)–Pr (remanent polarization))/Ed (maximum value of applied electric field).

2. The piezoelectric device according to claim 1, wherein the piezoelectric layer comprises a coercive electric field on each of a positive electric field side and a negative electric field side, and the drive circuit applies a positive electric field in a direction in which an absolute value of the coercive electric field takes on a small value and apply a negative electric field in a direction in which the absolute value of the coercive electric field takes on a large value.

3. The piezoelectric device according to claim 1, wherein the drive circuit allows the minimum value of the drive electric field to become more than or equal to 5 times the positive coercive electric field of the piezoelectric layer and allows the maximum value of the drive electric field to become less than or equal to 50 times the positive coercive electric field of the piezoelectric layer.

4. The piezoelectric element according to claim 1, wherein the piezoelectric layer of the piezoelectric device is made from potassium-sodium niobate.

5. A piezoelectric actuator by using the piezoelectric device according to claim 1.

6. A hard disk drive comprising the piezoelectric actuator according to claim 5.

7. An ink-jet printer apparatus comprising the piezoelectric actuator according to claim 5.

* * * * *